(12) United States Patent
Kim

(10) Patent No.: US 10,236,427 B2
(45) Date of Patent: Mar. 19, 2019

(54) LIGHT EMITTING DEVICE PACKAGE

(71) Applicant: LG INNOTEK CO., LTD., Seoul (KR)

(72) Inventor: Ki Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/817,732

(22) Filed: Aug. 4, 2015

(65) Prior Publication Data

US 2016/0043293 A1    Feb. 11, 2016

(30) Foreign Application Priority Data

Aug. 5, 2014  (KR) .................. 10-2014-0100524

(51) Int. Cl.
| | |
|---|---|
| H01L 33/62 | (2010.01) |
| H01L 33/50 | (2010.01) |
| H01L 33/38 | (2010.01) |
| H01L 33/60 | (2010.01) |
| H01L 33/36 | (2010.01) |

(52) U.S. Cl.
CPC .............. *H01L 33/62* (2013.01); *H01L 33/36* (2013.01); *H01L 33/38* (2013.01); *H01L 33/505* (2013.01); *H01L 33/60* (2013.01); *H01L 2224/48091* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 8,324,654 | B2 * | 12/2012 | An ................. | H01L 33/486 257/100 |
| 8,569,778 | B2 * | 10/2013 | Ong ................. | H01L 33/60 257/84 |
| 8,926,128 | B2 * | 1/2015 | Park ................. | G02F 1/133615 362/247 |
| 9,029,895 | B2 * | 5/2015 | Lee ................. | H01L 33/58 257/98 |
| 2005/0236628 | A1 * | 10/2005 | Matsuura ................. | H01L 33/60 257/79 |

(Continued)

FOREIGN PATENT DOCUMENTS

| | | |
|---|---|---|
| CN | 100352066 C | 11/2007 |
| CN | 203055988 U | 7/2013 |

(Continued)

*Primary Examiner* — Walter H. Swanson
*Assistant Examiner* — Kien Ly
(74) *Attorney, Agent, or Firm* — Birch, Stewart, Kolasch & Birch, LLP

(57) ABSTRACT

Embodiments provide a light emitting device package including a first lead frame and a second lead frame, a light emitting device electrically connected to each of the first lead frame and the second lead frame, the light emitting device having a first electrode pad asymmetrically formed on a top surface thereof, and a reflective member disposed around the light emitting device to reflect light emitted from the light emitting device. The reflective member is configured such that a standard deviation of tilts of a reflective surface of a first area, in which the first electrode pad is disposed, is greater than a standard deviation of tilts of a reflective surface of a second area opposite to the first area.

19 Claims, 16 Drawing Sheets

(56) References Cited

U.S. PATENT DOCUMENTS

| | | | |
|---|---|---|---|
| 2011/0109222 A1* | 5/2011 | Inoue | H01L 33/60 313/503 |
| 2012/0119230 A1* | 5/2012 | Chan | G02B 6/0023 257/88 |
| 2012/0205693 A1 | 8/2012 | Ong et al. | |
| 2012/0286301 A1* | 11/2012 | Kobayakawa | H01L 33/54 257/88 |
| 2013/0009191 A1* | 1/2013 | Wang | H01L 33/486 257/99 |
| 2013/0099661 A1* | 4/2013 | Gasse | H05B 33/10 313/512 |
| 2013/0148380 A1* | 6/2013 | Kim | F21V 7/00 362/613 |
| 2014/0063775 A1* | 3/2014 | Sawada | H01L 33/60 362/16 |
| 2014/0071689 A1* | 3/2014 | Yoon | H01L 33/54 362/296.01 |
| 2014/0347885 A1* | 11/2014 | Wilcox | F21S 8/061 362/612 |
| 2014/0367730 A1* | 12/2014 | Kim | H01L 33/38 257/99 |
| 2015/0221840 A1* | 8/2015 | O'Brien | H01L 25/0753 257/88 |
| 2015/0255693 A1* | 9/2015 | Baade | H01L 33/62 257/99 |
| 2015/0307717 A1* | 10/2015 | Kojima | C08L 83/04 257/98 |
| 2015/0353740 A1* | 12/2015 | Kojima | C08L 83/04 362/296.04 |

FOREIGN PATENT DOCUMENTS

| | | |
|---|---|---|
| CN | 103636012 A | 3/2014 |
| EP | 1385217 A2 | 1/2004 |
| EP | 2287931 A2 | 2/2011 |

\* cited by examiner

FIG. 8C

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 66.25 |  |  |  | 142.88 |  |  |  | 68.81 |
|  | % | 39% |  |  |  | 84% |  |  |  | 40% |
| 0.7F | Lux |  | 124.71 |  |  | 165.47 |  |  | 124.20 |  |
|  | % |  | 73% |  |  | 97% |  |  | 73% |  |
| 0.5F | Lux |  |  | 153.03 |  | 169.21 |  | 156.43 |  |  |
|  | % |  |  | 90% |  | 100% |  | 92% |  |  |
| 0.3F | Lux |  |  |  | 159.14 | 165.94 | 167.00 |  |  |  |
|  | % |  |  |  | 94% | 98% | 98% |  |  |  |
| Center | Lux | 85.08 | 150.88 | 163.89 | 163.75 | 169.97 | 173.54 | 168.48 | 146.83 | 87.22 |
|  | % | 50% | 89% | 96% | 96% | 100% | 102% | 99% | 86% | 51% |
| 0.3F | Lux |  |  |  | 158.19 | 166.79 | 166.56 |  |  |  |
|  | % |  |  |  | 93% | 98% | 98% |  |  |  |
| 0.5F | Lux |  |  | 153.00 |  | 170.56 |  | 169.60 |  |  |
|  | % |  |  | 90% |  | 100% |  | 100% |  |  |
| 0.7F | Lux |  | 124.25 |  |  | 163.95 |  |  | 124.59 |  |
|  | % |  | 73% |  |  | 96% |  |  | 73% |  |
| 1.0F | Lux | 66.90 |  |  |  | 141.45 |  |  |  | 68.78 |
|  | % | 39% |  |  |  | 83% |  |  |  | 40% |

FIG. 9C

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 66.26 |  |  |  | 141.60 |  |  |  | 69.27 |
|  | % | 39% |  |  |  | 83% |  |  |  | 41% |
| 0.7F | Lux |  | 124.71 |  |  | 165.86 |  |  | 114.80 |  |
|  | % |  | 73% |  |  | 97% |  |  | 67% |  |
| 0.5F | Lux |  |  | 153.55 |  | 169.58 |  | 149.53 |  |  |
|  | % |  |  | 90% |  | 100% |  | 88% |  |  |
| 0.3F | Lux |  |  |  | 164.33 | 166.20 | 164.17 |  |  |  |
|  | % |  |  |  | 97% | 98% | 96% |  |  |  |
| Center | Lux | 85.07 | 150.85 | 164.16 | 169.82 | 170.29 | 170.37 | 159.54 | 132.14 | 91.66 |
|  | % | 50% | 89% | 96% | 100% | 100% | 100% | 94% | 78% | 54% |
| 0.3F | Lux |  |  |  | 163.01 | 167.80 | 164.36 |  |  |  |
|  | % |  |  |  | 96% | 99% | 97% |  |  |  |
| 0.5F | Lux |  |  | 153.66 |  | 171.52 |  | 164.86 |  |  |
|  | % |  |  | 90% |  | 101% |  | 97% |  |  |
| 0.7F | Lux |  | 124.23 |  |  | 164.23 |  |  | 115.60 |  |
|  | % |  | 73% |  |  | 96% |  |  | 68% |  |
| 1.0F | Lux | 66.89 |  |  |  | 140.00 |  |  |  | 69.28 |
|  | % | 39% |  |  |  | 82% |  |  |  | 41% |

FIG. 10C

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 61.83 |  |  |  | 137.37 |  |  |  | 79.46 |
|  | % | 39% |  |  |  | 87% |  |  |  | 50% |
| 0.7F | Lux |  | 122.77 |  |  | 155.75 |  |  | 125.7 |  |
|  | % |  | 77% |  |  | 98% |  |  | 79% |  |
| 0.5F | Lux |  |  | 152.73 |  | 157.75 |  | 156.31 |  |  |
|  | % |  |  | 96% |  | 99% |  | 99% |  |  |
| 0.3F | Lux |  |  |  | 157.42 | 154.79 | 155.18 |  |  |  |
|  | % |  |  |  | 99% | 98% | 98% |  |  |  |
| Center | Lux | 79.7 | 149.86 | 163.83 | 162.46 | 158.63 | 162.99 | 160.54 | 146.15 | 109.6 |
|  | % | 50% | 94% | 103% | 102% | 100% | 103% | 101% | 92% | 69% |
| 0.3F | Lux |  |  |  | 156.9 | 155.19 | 155.61 |  |  |  |
|  | % |  |  |  | 99% | 98% | 98% |  |  |  |
| 0.5F | Lux |  |  | 152.84 |  | 159.92 |  | 158.81 |  |  |
|  | % |  |  | 96% |  | 101% |  | 100% |  |  |
| 0.7F | Lux |  | 122.35 |  |  | 153.36 |  |  | 126.8 |  |
|  | % |  | 77% |  |  | 97% |  |  | 80% |  |
| 1.0F | Lux | 62.51 |  |  |  | 135.94 |  |  |  | 79.11 |
|  | % | 39% |  |  |  | 86% |  |  |  | 50% |

FIG. 11C

| | | 1.0F | 0.7F | 0.5F | 0.3F | Center | 0.3F | 0.5F | 0.7F | 1.0F |
|---|---|---|---|---|---|---|---|---|---|---|
| 1.0F | Lux | 65.09 | | | | 141.01 | | | | 70.69 |
| | % | 39% | | | | 84% | | | | 42% |
| 0.7F | Lux | | 124.27 | | | 163.45 | | | 116.19 | |
| | % | | 74% | | | 97% | | | 69% | |
| 0.5F | Lux | | | 153.53 | | 167.09 | | 148.99 | | |
| | % | | | 91% | | 100% | | 89% | | |
| 0.3F | Lux | | | | 164.12 | 162.77 | 160.74 | | | |
| | % | | | | 98% | 97% | 96% | | | |
| Center | Lux | 83.49 | 150.75 | 164.33 | 169.62 | 167.91 | 167.27 | 156.68 | 131.86 | 94.5 |
| | % | 50% | 90% | 98% | 101% | 100% | 100% | 93% | 79% | 56% |
| 0.3F | Lux | | | | 162.85 | 165.17 | 160.76 | | | |
| | % | | | | 97% | 98% | 96% | | | |
| 0.5F | Lux | | | 153.56 | | 169.27 | | 162.61 | | |
| | % | | | 91% | | 101% | | 97% | | |
| 0.7F | Lux | | 123.74 | | | 162.26 | | | 116.97 | |
| | % | | 74% | | | 97% | | | 70% | |
| 1.0F | Lux | 65.63 | | | | 139.02 | | | | 70.59 |
| | % | 39% | | | | 83% | | | | 42% |

LIGHT EMITTING DEVICE PACKAGE

CROSS REFERENCE TO RELATED APPLICATION

This application claims priority under 35 U.S.C. § 119 to Korean Patent Application No. 10-2014-0100524, filed in Korea on 5 Aug., 2014, which are hereby incorporated in its entirety by reference as if fully set forth herein.

TECHNICAL FIELD

Embodiments relate to a light emitting device package and, more particularly, to a light emitting device package which provides the outward transmission of an even flux of light emitted from a light source.

BACKGROUND

Group III-V compound semiconductors such as, for example, GaN and AlGaN are widely used for optoelectronics and electronics because of many advantages such as, for example, easily controllable wide band gap energy.

In particular, light emitting devices, such as light emitting diodes or laser diodes, which use group III-V or II-VI compound semiconductors, are capable of emitting visible and ultraviolet light of various colors such as red, green, and blue owing to development of device materials and thin film growth techniques. These light emitting devices are also capable of emitting white light with high luminous efficacy through use of a fluorescent substance or color combination and have several advantages of low power consumption, semi-permanent lifespan, fast response speed, safety, and environmental friendliness as compared to conventional light sources such as, for example, fluorescent lamps and incandescent lamps.

Accordingly, application sectors of the light emitting devices are expanded up to transmission modules of optical communication means, light emitting diode backlights to replace Cold Cathode Fluorescence Lamps (CCFLs) which serve as backlights of Liquid Crystal Display (LCD) apparatuses, white light emitting diode lighting apparatus to replace fluorescent lamps or incandescent lamps, vehicular headlamps, and traffic lights.

In a light emitting device, a light emitting structure, which includes an undoped semiconductor layer (un-GaN layer), a first conductive semiconductor layer (n-GaN layer), an active layer (MQW layer), and a second conductive semiconductor layer (p-GaN layer), may be formed on a substrate formed of, for example, sapphire, and a first electrode and a second electrode may be disposed respectively on the first conductive semiconductor layer and the second conductive semiconductor layer.

The light emitting device is configured to emit light having energy determined by the inherent energy band of a constituent material of the active layer in which electrons injected through the first conductive semiconductor layer and holes injected through the second conductive semiconductor layer meet each other. The light emitted from the active layer may vary based on the composition of the constituent material of the active layer, and may be, for example, blue light, ultraviolet (UV) light, deep UV light, or light of various other wavelength ranges.

Light in a first wavelength range emitted from the light emitting device may excite phosphors, and light in a second wavelength range may be emitted from the phosphors. The phosphors may be included in a molding part surrounding the light emitting device, or may be disposed in the form of a phosphor film.

FIG. 1 is a sectional view illustrating a light emitting device package, and FIG. 2 is a top view illustrating a light emitting device illustrated in FIG. 1.

The light emitting device package 100 includes a body 110 having a cavity, a first lead frame 121 and a second lead frame 122 installed to the body 110, a light emitting device 130 installed to the body 110 and electrically connected to the first lead frame 121 and the second lead frame 122, and a molding part 160 formed in the cavity.

The light emitting device 130 may be directly electrically connected to the first lead frame 121, and a first electrode pad 140 on the light emitting device 130 may be bonded to the second lead frame 122 via a wire 150. The molding part 160 may include phosphors 165.

A portion of the body 110, which serves as a reflective surface R at the lateral side of the cavity, may configure a slope. When the light emitting device 130 is disposed at the center of the bottom surface of the cavity, the reflective surface R of the cavity may have a left-right symmetrical shape.

However, the conventional light emitting device has the following problem.

Since at least one first electrode pad 140 is disposed on the top of the light emitting device 130, the area in which the first electrode pad 140 is disposed may suffer from a reduction in the flux of light because light emitted from the interior of the light emitting device 130 is reflected by the first electrode pad 140.

That is, referring to FIGS. 2(a) and (b), the flux of light at the right area, provided with the pad 140, may be smaller than the flux of light at the left area. As the development of micro-processing technologies leads to a reduction in the size of a cavity structure, the flux of light emitted from the light emitting device package 100 may exhibit uneven distribution according to the arrangement of the first electrode pad 140 on the light emitting device 130. More specifically, since the flux of light emitted from the top of the right area of the light emitting device 130 is small, the reflection of the reflective surface R may cause the smaller flux of light to propagate leftward, outside of the light emitting device package 100.

SUMMARY

Embodiments provide a light emitting device package which is capable of emitting an even flux of light.

In one embodiment, a light emitting device package includes a first lead frame and a second lead frame, a light emitting device electrically connected to each of the first lead frame and the second lead frame, the light emitting device having a first electrode pad asymmetrically formed on a top surface thereof, and a reflective member located around the light emitting device to reflect light emitted from the light emitting device, wherein the reflective member is configured such that a standard deviation of tilts of a reflective surface of a first area, in which the first electrode pad is located, is greater than a standard deviation of tilts of a reflective surface of a second area opposite to the first area.

In another embodiment, a light emitting device package includes a first lead frame and a second lead frame, a light emitting device electrically connected to each of the first lead frame and the second lead frame, the light emitting device having a first electrode pad asymmetrically formed on a top surface thereof, and a reflective member located around the light emitting device to reflect light emitted from the light emitting device, wherein, in a light emission area of the reflective member, a distance from a point corresponding to a central area of the light emitting device to a reflective surface of a first area, in which the first electrode pad is located, is greater than a distance from the point corresponding to the central area of the light emitting device to a reflective surface of a second area opposite to the first area.

The reflective member may be configured such that reflective surfaces of a third area and a fourth area, intersecting the first area and the second area, have the same standard deviation of tilts thereof.

The reflective member may be configured such that the standard deviation of the tilts of the reflective surface of the first area is greater than the standard deviation of the tilts of the reflective surface of the second area, and equal to or less than 7 times the standard deviation of the tilts of the reflective surface of the second area.

The reflective member may further include a third area and a fourth area intersecting the first area and the second area, and, in a light emission area of the reflective member, a distance from a point corresponding to a central area of the light emitting device to a reflective surface of the third area may be greater than a distance from the point corresponding to the central area of the light emitting device to a reflective surface of the fourth area.

In a light emission area of the reflective member, a distance from a point corresponding to a central area of the light emitting device to the reflective surface of the second area may be within a range from 93% to 99% of a distance from the point corresponding to the central area of the light emitting device to the reflective surface of the first area.

BRIEF DESCRIPTION OF THE DRAWINGS

Arrangements and embodiments may be described in detail with reference to the following drawings in which like reference numerals refer to like elements and wherein:

FIGS. 8A to 8C are views illustrating measured results of the flux of light emitted from a light emitting device package having a reflective surface structure according to an embodiment of Table 1;

FIGS. 9A to 9C are views illustrating measured results of the flux of light emitted from a light emitting device package having a reflective surface structure according to an embodiment of Table 2;

FIGS. 10A to 10C are views illustrating measured results of the flux of light emitted from a light emitting device package having a reflective surface structure according to an embodiment of Table 3; and FIGS. 11A to 11C are views illustrating measured results of the flux of light emitted from a light emitting device package having a reflective surface structure according to a comparative embodiment of Table 4.

DESCRIPTION OF SPECIFIC EMBODIMENTS

Hereinafter, exemplary embodiments to concretely realize the above object will be described in detail with reference to the accompanying drawings.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

Figure 1:
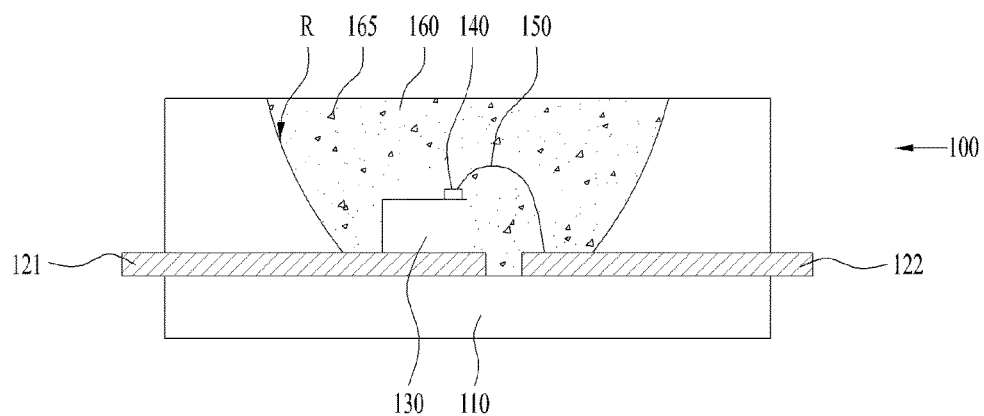
FIG. 1 is a sectional view illustrating a light emitting device package.
Figure 2:
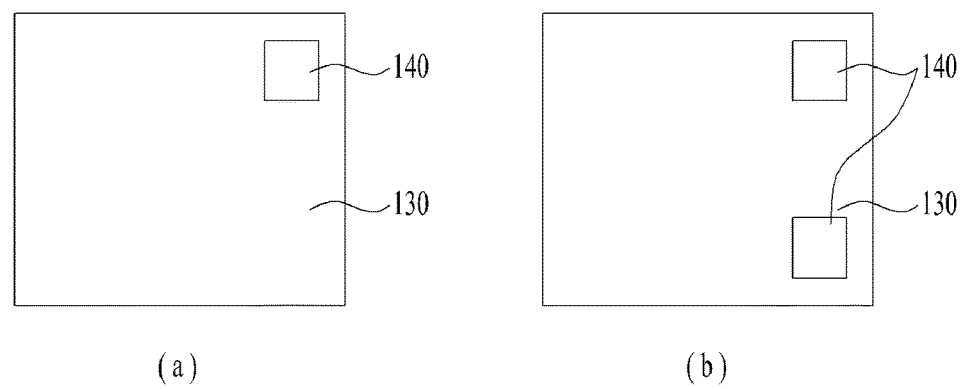
FIG. 2 is a top view illustrating a light emitting device illustrated in FIG. 1.
Figure 3:
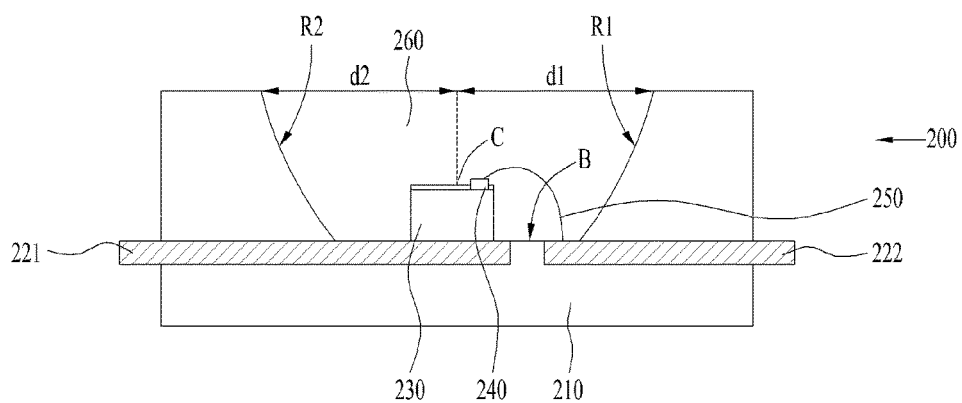
FIG. 3 is a sectional view illustrating one embodiment of a light emitting device package.
Figure 4A:
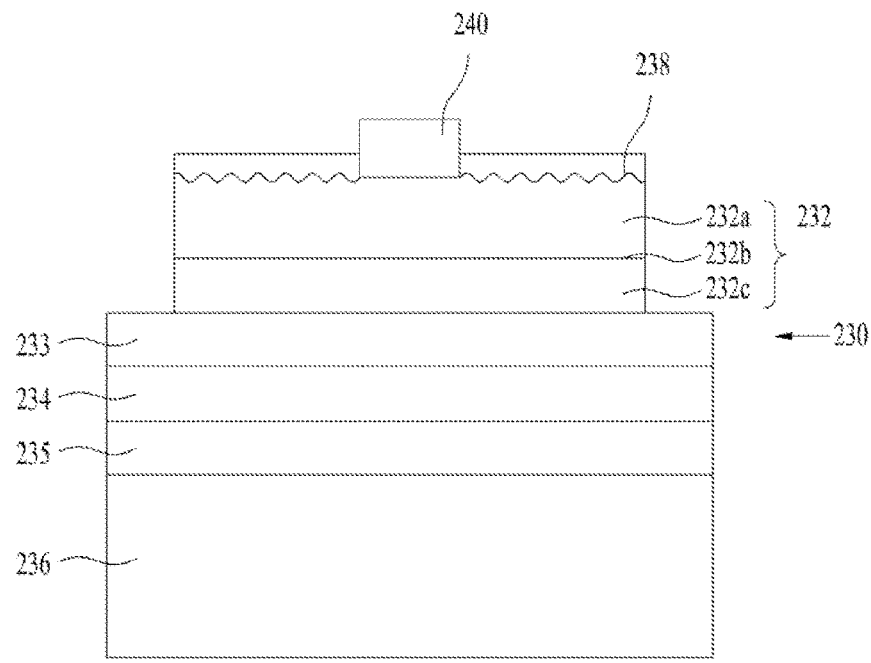
FIG. 4A is a sectional view illustrating a light emitting device illustrated in FIG. 3.
Figure 4B:
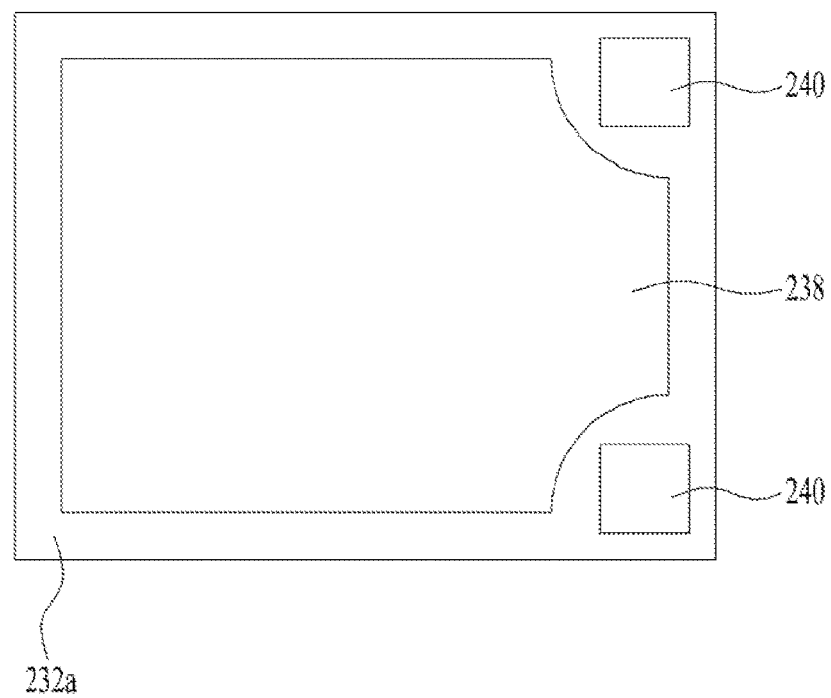
FIG. 4B is a plan view illustrating the light emitting device illustrated in FIG. 3.

FIG. 3 is a sectional view illustrating one embodiment of a light emitting device package, FIG. 4A is a sectional view illustrating a light emitting device illustrated in FIG. 3, and FIG. 4B is a plan view illustrating the light emitting device illustrated in FIG. 3.

The light emitting device package 200 according to the embodiment includes a body 210 having a cavity, a first lead frame 221 and a second lead frame 222 installed to the body 210, a light emitting device 230 installed to the body 210 and electrically connected to the first lead frame 221 and the second lead frame 222, and a molding part 260 formed in the cavity.

The body 210 may be formed of a silicon material, a synthetic resin material, or a metal material. When the body 210 is formed of a conductive material such as, for example, a metal material, although not illustrated, an insulation layer may be coated over a surface of the body 210 to prevent electrical short-circuit between the first and second lead frames 221 and 222. The cavity formed in the body 210 may include a bottom surface B and reflective surfaces $R_1$ and $R_2$ forming sidewalls. The light emitting device 230 may be disposed on the bottom surface B of the cavity.

A reflective member may be formed into a layer, for example, by coating the aforementioned reflective surfaces $R_1$ and $R_2$ with a highly reflective material such as, for example, aluminum or silver, or the body 210 may serve as a reflective member.

The first lead frame 221 and the second lead frame 222 are electrically isolated from each other, and serve to supply current to the light emitting device 230. The first lead frame 221 and the second lead frame 222 may reflect light emitted from the light emitting device 230 to increase luminous efficacy and may outwardly dissipate heat generated in the light emitting device 230.

The light emitting device 230 may be fixed to the bottom surface of the package body 210 using conductive paste (not illustrated), and the first lead frame 221 and the second lead frame 222 may be bonded to each other via a wire 250. The molding part 260 may surround the light emitting device 230 to protect the same.

In the light emitting device according to the present embodiment, as will be described below, phosphors may be included in a phosphor layer 238 in the form of a film, or may be included in the molding part 260.

In FIG. 4A, the light emitting device 230 is a vertical type light emitting device in which a bonding layer 235, a reflective layer 234, and an ohmic layer 233 are disposed in sequence on a support substrate 236, a light emitting structure 232 is disposed on the ohmic layer 233, and the phosphor layer 238 is disposed on the light emitting structure 232.

The light emitting structure 232 includes a first conductive semiconductor layer 232a, an active layer 232b, and a second conductive semiconductor layer 232c.

The first conductive semiconductor layer 232a may be formed of compound semiconductors such as, for example, group III-V or group II-VI compound semiconductors and may be doped with a first conductive dopant. The first conductive semiconductor layer 232a may be formed of at least one material selected from among a semiconductor material having a composition of $Al_xIn_yGa_{(1-x-y)}N$ ($0 \leq x \leq 1$, $0 \leq y \leq 1$, $0 \leq x+y \leq 1$), AlGaN, GaN, InAlGaN, AlGaAs, GaP, GaAs, GaAsP, and AlGaInP.

When the first conductive semiconductor layer 232a is an n-type semiconductor layer, the first conductive dopant may include an n-type dopant such as, for example, Si, Ge, Sn, Se or Te. The first conductive semiconductor layer 232a may be a single layer or multiple layers, without being limited thereto.

The active layer 232b may be interposed between the first conductive semiconductor layer 232a and the second conductive semiconductor layer 232c. The active layer 232b may have any one of a double hetero structure, a multi-well structure, a single quantum well structure, a multi quantum well structure, a quantum wire structure, or a quantum dot structure.

The active layer 232b may be formed of group III-V compound semiconductors and may have a pair structure of a well layer and a barrier layer such as, for example, any one or more of AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto.

The well layer may be formed of a material having a smaller energy band gap than an energy band gap of the barrier layer.

The second conductive semiconductor layer 232c may be formed of compound semiconductors. Specifically, the second conductive semiconductor layer 232c may be formed of compound semiconductors such as, for example, group III-V or group II-VI compound semiconductors and may be doped with a second conductive dopant. The second conductive semiconductor layer 232c may be formed of, for example, at least one material selected from among a semiconductor material having a composition of $In_xAl_yGa_{(1-x-y)}N$ ($0 \leq x \leq 1$, $0 \leq y \leq 1$, $0 \leq x+y \leq 1$), AlGaN, GaNAlInN, AlGaAs, GaP, GaAs, GaAsP, and AlGaInP. For example, the second conductive semiconductor layer 232c may be formed of $Al_xGa_{(1-x)}N$.

When the second conductive semiconductor layer 232c is a p-type semiconductor layer, the second conductive dopant may include a p-type dopant such as, for example, Mg, Zn, Ca, Sr, or Ba. The second conductive semiconductor layer 232c may be a single layer or multiple layers, without being limited thereto.

Although not illustrated, an electron blocking layer may be interposed between the active layer 232b and the second conductive semiconductor layer 232c. The electron blocking layer may have a superlattice structure. For example, the superlattice structure may include an AlGaN layer doped with a second conductive dopant and a GaN layer having a different aluminum composition ratio from the AlGaN layer, the AlGaN layer and the GaN layer being alternately disposed in multiple layers.

The first conductive semiconductor layer 232a may have a patterned surface to enhance light extraction efficiency, and the phosphor layer 238 may be disposed on the surface of the first conductive semiconductor layer 232a. The phosphor layer 238 may include silicon as a basic material and phosphors.

A first electrode pad 240 may be disposed on the surface of the first conductive semiconductor layer 232a. As illustrated, a surface area of the first conductive semiconductor layer 232a, in which the first electrode pad 240 is located, may be not patterned. The first electrode pad 240 may be formed of a conductive material. Specifically, the first electrode pad 240 may be formed of a metal and, more specifically, the first electrode pad 240 may have a single layer structure or a multi-layer structure including at least one of aluminum (Al), titanium (Ti), chrome (Cr), nickel (Ni), copper (Cu), and gold (Au).

In addition, a pair of first electrode pads 240 may be arranged in a first area of the light emitting device 230 so as to be spaced apart from each other.

Since the first electrode pad 240 may reflect or block light emitted from the active layer 232b, the flux of light, emitted from the light emitting device 230 and introduced to the reflective surface $R_1$ adjacent to the first area, may be smaller than the flux of light emitted from the light emitting device 230 and introduced to the reflective surface $R_2$ adjacent to a second area.

A passivation layer (not illustrated) may be formed around the light emitting structure 232. The passivation layer may be formed of an insulation material. The insulation material may include a nonconductive oxide or nitride. For example, the passivation layer may be a silicon oxide ($SiO_2$) layer, a silicon nitride layer, or a silicon aluminum layer.

It is necessary to dispose a second electrode below the light emitting structure 232. The ohmic layer 233 and the reflective layer 234 may serve as the second electrode.

The ohmic layer 233 may have a thickness of about 200 angstroms. The ohmic layer 233 may be formed of at least one selected from among Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited to these materials.

The reflective layer 234 may be a metal layer formed of molybdenum (Mo), aluminum (Al), silver (Ag), nickel (Ni), platinum (Pt), rhodium (Rh), or alloys including Al, Ag, Pt or Rh. Aluminum, silver, or the like may effectively reflect light emitted from the active layer 232b to significantly enhance light-extraction efficiency of a semiconductor device, and molybdenum may be advantageous for the growth of plating on a protrusion that will be described hereinafter.

The support substrate 236 may be formed of a conductive material such as, for example, a metal or a semiconductor material. More particularly, the support substrate 236 may be formed of a metal having high electric conductivity and thermal conductivity and may be formed of a high thermal conductivity material (e.g., a metal) in order to sufficiently dissipate heat generated during operation of a semiconductor device. For example, the support substrate 236 may be formed of a material selected from the group of molybdenum (Mo), silicon (Si), tungsten (W), copper (Cu) and aluminum (Al), or alloys thereof. In addition, the support substrate 236 may selectively include gold (Au), copper (Cu) alloy, nickel (Ni), copper-tungsten (Cu—W), carrier wafer (e.g., GaN, Si, Ge, GaAs, ZnO, SiGe, SiC, SiGe, or $Ga_2O_3$).

The support substrate 236 may have a thickness of 50 μm~200 μm in order to achieve a sufficient mechanical strength to be efficiently separated as a chip during a scribing process and a breaking process without causing bending of a nitride semiconductor device.

The bonding layer 235 serves to bond the reflective layer 234 and the support substrate 236 to each other. The bonding layer 235 may be formed of a material selected from the group of gold (Au), tin (Sn), indium (In), aluminum (Al), silicon (Si), silver (Ag), nickel (Ni), and copper (Cu), or alloys thereof.

As exemplarily illustrated in FIG. 4B, the phosphor layer 238 is disposed on the first conductive semiconductor layer 232a of the light emitting device 230 and a pair of first electrode pads 240 is disposed on one side of the light emitting device 230.

In FIG. 3, the first electrode pad 240 is asymmetrically disposed on the right side of the top of the light emitting device 230. At this time, assuming that the area in which the first electrode pad 240 is located is referred to as a first area and the area opposite to the first area is referred to as a second area, the reflective surface $R_1$ adjacent to the first area and the reflective surface $R_2$ adjacent to the second area within the cavity of the light emitting device package 200 may have different curvatures.

As the two reflective surfaces $R_1$ and $R_2$ have different curvatures as described above, an opening formed in the top of the light emitting device package 200 may be asymmetrical. The opening may serve as a light emission area, from which light is emitted out of the light emitting device package. That is, the distances $d_1$ and $d_2$ from the top position of the package, corresponding to the top central area C of the light emitting device 230, to the two reflective surfaces $R_1$ and $R_2$ may differ from each other.

Figure 5:
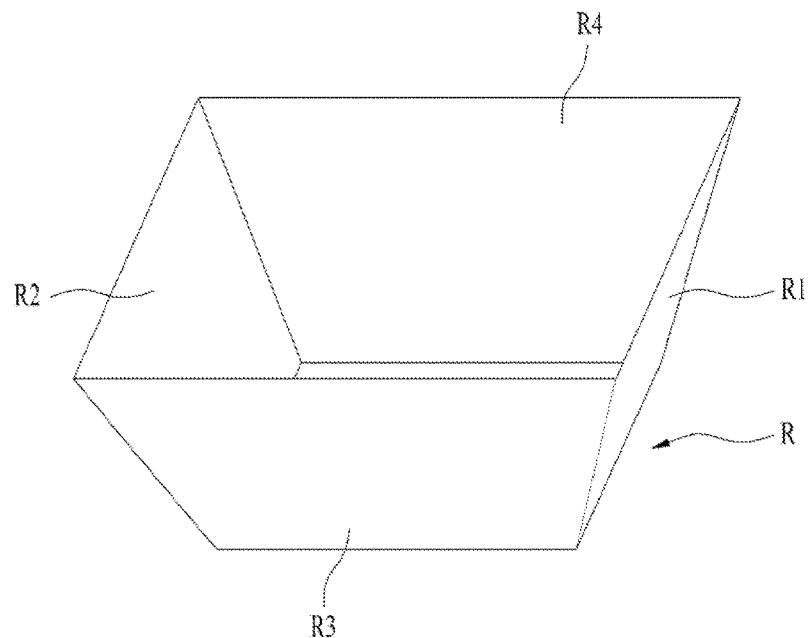
FIG. 5 is a view illustrating reflective surfaces of the light emitting device illustrated in FIG. 3.

FIG. 5 is a view illustrating reflective surfaces of the light emitting device illustrated in FIG. 3.

The reflective surface $R_1$ of the first area and the reflective surface $R_2$ of the second area, described above, may be arranged to face each other. Reflective surfaces between the two reflective surface $R_1$ and $R_2$ may be referred to as a reflective surface $R_3$ of a third area and a reflective surface $R_4$ of a fourth area respectively.

Figure 6:
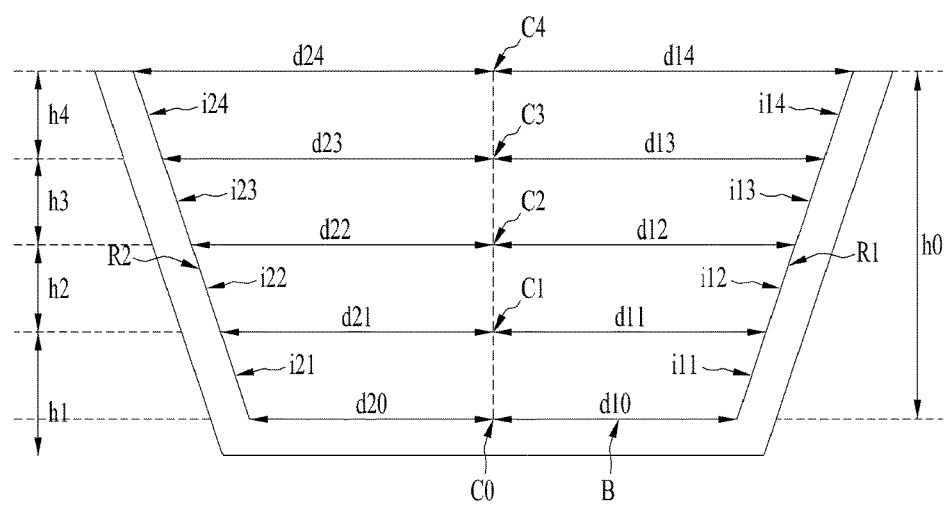
FIG. 6 is a sectional view illustrating the reflective surfaces of FIG. 5 with respect to a first direction.
Figure 7:
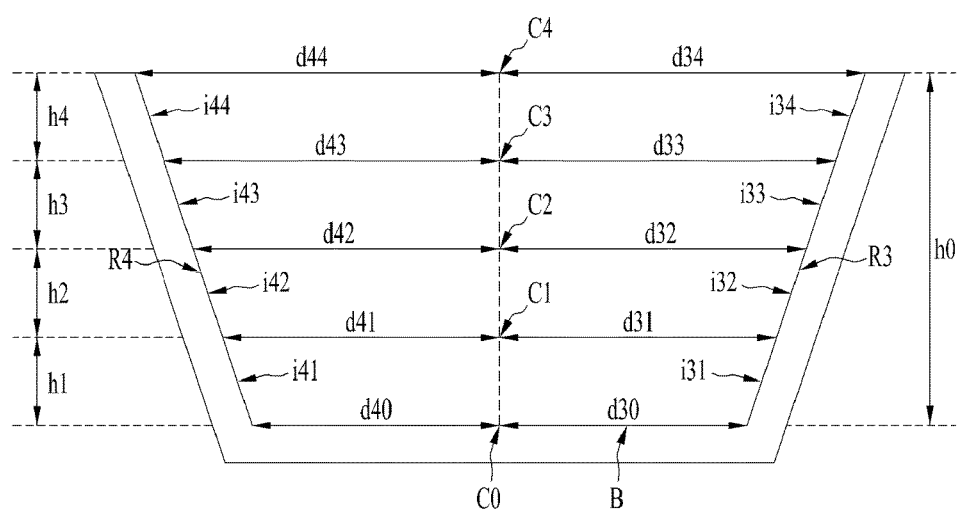
FIG. 7 is a sectional view illustrating the reflective surfaces of FIG. 5 with respect to a second direction.

In FIG. 5, assuming that the direction that connects the reflective surface $R_1$ of the first area and the reflective surface $R_2$ of the second area to each other is referred to as a first direction and the direction that connects the reflective surface $R_3$ of the third area and the reflective surface $R_4$ of the fourth area to each other is referred to as a second direction, FIG. 6 is a sectional view illustrating the reflective surfaces of FIG. 5 with respect to the first direction, and FIG. 7 is a sectional view illustrating the reflective surfaces of FIG. 5 with respect to the second direction.

In FIG. 6, assuming that the overall height from the bottom surface B of the cavity to the opening as the light emission surface of the cavity is $h_0$, the height from the bottom surface B of the cavity to the opening may be divided into four equal heights $h_1$, $h_2$, $h_3$ and $h_4$.

At this time, with regard to the reflective surface $R_1$ of the first area, a region corresponding to the height $h_1$ may be referred to as a first-first slope $i_{11}$, a region corresponding to the height $h_2$ may be referred to as a first-second slope $i_{12}$, a region corresponding to the height $h_3$ may be referred to as a first-third slope $i_{13}$, and a region corresponding to the height $h_4$ may be referred to as a first-fourth slope $i_{14}$.

In addition, with regard to the reflective surface $R_2$ of the second area, a region corresponding to the height $h_1$ may be referred to as a second-first slope $i_{21}$, a region corresponding to the height $h_2$ may be referred to as a second-second slope $i_{22}$, a region corresponding to the height $h_3$ may be referred to as a second-third slope $i_{23}$, and a region corresponding to the height $h_4$ may be referred to as a second-fourth slope $i_{24}$.

In addition, with regard to the central area $C_0$ of the bottom surface B of the cavity, a point corresponding to the height $h_1$ may be designated by $C_1$, a point corresponding to the height $h_2$ may be designated by $C_2$, a point corresponding to the height $h_3$ may be designated by $C_0$, and a point corresponding to the height $h_4$ may be designated by $C_4$.

Table 1 to Table 3 represent embodiments which adopt different curvatures of the two reflective surfaces $R_1$ and $R_2$ or which adopt asymmetrical openings in the top of the light emitting device package 200.

TABLE 1

| STDEV ($R_1$) | 0.366487 | STDEV ($R_2$) | 0.052611 |
|---|---|---|---|
| $d_{10}$ | 0.700 | $d_{20}$ | 0.700 |
| $d_{11}$ | 0.810 | $d_{21}$ | 0.795 |
| $d_{12}$ | 0.908 | $d_{22}$ | 0.888 |
| $d_{13}$ | 0.994 | $d_{23}$ | 0.980 |
| $d_{14}$ | 1.070 | $d_{24}$ | 1.070 |

TABLE 2

| STDEV ($R_1$) | 0.366487 | STDEV ($R_2$) | 0.366773 |
|---|---|---|---|
| $d_{10}$ | 0.700 | $d_{20}$ | 0.700 |
| $d_{11}$ | 0.810 | $d_{21}$ | 0.787 |
| $d_{12}$ | 0.908 | $d_{22}$ | 0.865 |
| $d_{13}$ | 0.994 | $d_{23}$ | 0.936 |
| $d_{14}$ | 1.070 | $d_{24}$ | 1 |

TABLE 3

| STDEV ($R_1$) | 0.366487 | STDEV ($R_2$) | 0.056566 |
|---|---|---|---|
| $d_{10}$ | 0.700 | $d_{20}$ | 0.700 |
| $d_{11}$ | 0.810 | $d_{21}$ | 0.785 |
| $d_{12}$ | 0.908 | $d_{22}$ | 0.872 |
| $d_{13}$ | 0.994 | $d_{23}$ | 0.960 |
| $d_{14}$ | 1.070 | $d_{24}$ | 1.050 |

In Table 1 to Table 3, $d_{xx}$ is the distance in units of mm, and STDEV($R_x$) is the standard deviation of the tilts of the slopes constituting the reflective surface. For example, STDEV($R_1$) may be the standard deviation of the tilts of the four slopes $i_{11}$, $i_{12}$, $i_{13}$, and $i_{14}$, and the tilts of the four slopes $i_{11}$, $i_{12}$, $i_{13}$, and $i_{14}$ may be respectively $h_1/(d_{11}-d_{10})$, $h_2/(d_{12}-d_{11})$, $h_3/(d_{13}-d_{12})$, and $h_4/(d_{14}-d_{13})$.

In the embodiment illustrated in Table 1, $d_{14}$ and $D_{24}$ have the same value of 1.070 mm, and STDEV($R_1$) may be 0.366487, which is about 7 times STDEV($R_2$) of 0.052611. In the embodiment illustrated in Table 2, $d_{14}$ is 1.070 mm, $d_{24}$ is 1 mm, and STDEV($R_1$) may be 0.366487, which is about the same as STDEV($R_2$) of 0.366773. In addition, in the embodiment illustrated in Table 3, $d_{14}$ is 1.070 mm, $d_{24}$ is 1.050 mm, and STDEV($R_1$) may be 0.366487, which is about 6.5 times STDEV($R_2$) of 0.056566.

In the embodiment of Table 1, the distances $d_{14}$ and $d_{24}$ from the point in the opening, which is the light emission surface of the light emitting device package corresponding to the top central region C of the light emitting device 230, to the two reflective surfaces $R_1$ and $R_2$ have the same value of 1.070 mm. On the other hand, in the embodiment of Table 2, the distance $d_{14}$ may be 1.070 mm, which is greater than the distance $d_{24}$ of 1 mm. In addition, in the embodiment of Table 3, the distance $d_{14}$ may be 1.070 mm, which is greater than the distance $d_{24}$ of 1.050 mm.

The distance $d_{24}$ in the embodiment of Table 2 is 1 mm, which is 93.5% of the distance $d_{14}$ of 1.070 mm, and the distance $d_{24}$ in the embodiment of Table 3 is 1.050 mm, which is 98.1% of the distance $d_{14}$ of 1.070 mm.

That is, the distance $d_{24}$ from the position in the opening, which is the light emission surface of the light emitting device package corresponding to the top central region C of the light emitting device 230, to the reflective surface $R_2$ in the second area opposite to the first area may be smaller than the distance $d_{14}$ from the position in the opening, which is the light emission surface of the light emitting device package corresponding to the top central region C of the light emitting device 230, to the reflective surface $R_1$ in the area adjacent to the first area in which the electrode pad of the light emitting device is located. More specifically, the distance $d_{24}$ may be within a range from 93% to 99% of the distance $d_{14}$.

When below 93%, the uniformity of light may be deteriorated outside the first area and the second area. When above 99%, the length of the opening in the first area is equal to or smaller than the length of the opening in the second area, which may cause a reduction in the flux of light emitted out of the light emitting device package in the first area.

In addition, variation in the average tilt of the reflective surface R in the area adjacent to the first area in which the electrode pad of the light emitting device is located may be greater than variation in the average tilt of the reflective surface R in the second area which is opposite to the first area. That is, in FIG. 3, the tilt of the reflective surface $R_1$ of the first area may vary more steeply than the tilt of the reflective surface $R_2$ of the second area.

In the embodiments illustrated in Table 1 to Table 3, since the first electrode pad 240 of the light emitting device 230 is located at the first area, the flux of light emitted from the light emitting device 230 is greater at the second area. Accordingly, the distance $d_{14}$ at the opening with regard to the first area may be set to be greater than the distance $d_{24}$ at the opening with regard to the second area, or the standard deviation $STDEV_1$ of the tilts of the four slopes constituting the reflective surface of the first area may be set to be greater than the standard deviation $STDEV_2$ of the tilts of the four slopes constituting the reflective surface of the second area.

Specifically, the standard deviation $STDEV_1$ of the tilts of the four slopes constituting the reflective surface corresponding to the first area may be 7 or fewer times the standard deviation $STDEV_2$ of the tilts of the four slopes constituting the reflective surface of the second area.

The electrode pad is located in the area adjacent to the first area of the light emitting device such that a smaller flux of light is emitted compared to that of the second area. As such, a smaller flux of light is introduced to the reflective surface corresponding to the first area.

At this time, when the standard deviation $STDEV_1$ of the tilts of the four slopes constituting the reflective surface corresponding to the first area is greater than the standard deviation $STDEV_2$ of the tilts of the four slopes constituting the reflective surface corresponding to the second area, the reflective surface of the first area may reflect light over a wide angle, causing an increased flux of light to be emitted out of the light emitting device package in the second area, which may provide the even distribution of light in an outside area of the light emitting device package corresponding to the first area and the second area.

When the standard deviation $STDEV_1$ of the tilts of the four slopes constituting the reflective surface corresponding to the first area exceeds 7 times the standard deviation $STDEV_2$ of the tilts of the four slopes constituting the reflective surface corresponding to the second area, the flux of light emitted out of the light emitting device package in the first area may be greater than the flux of light emitted out of the light emitting device package in the second area.

The following Table 4 illustrates a comparative embodiment in which reflective surfaces are equally and symmetrically formed at the first area and the second area of the light emitting device package.

TABLE 4

| $STDEV (R_1)$ | 0.366487 | $STDEV (R_2)$ | 0.366487 |
|---|---|---|---|
| $d_{10}$ | 0.700 | $d_{20}$ | 0.700 |
| $d_{11}$ | 0.810 | $d_{21}$ | 0.810 |
| $d_{12}$ | 0.908 | $d_{22}$ | 0.908 |
| $d_{13}$ | 0.994 | $d_{23}$ | 0.994 |
| $d_{14}$ | 1.070 | $d_{24}$ | 1.070 |

In FIG. 7, assuming that the height from the bottom surface B of the cavity to the opening formed in the light emission surface of the cavity is $h_0$, the height from the bottom surface B of the cavity to the opening may be divided into four equal heights $h_1$, $h_2$, $h_3$ and $h_4$.

At this time, with regard to the reflective surface $R_3$ of the third area, a region corresponding to the height $h_1$ may be referred to as a third-first slope $i_{31}$, a region corresponding to the height $h_2$ may be referred to as a third-second slope $i_{32}$, a region corresponding to the height $h_3$ may be referred to as a third-third slope $i_{33}$, and a region corresponding to the height $h_4$ may be referred to as a third-fourth slope $i_{34}$.

In addition, with regard to the reflective surface $R_4$ of the fourth area, a region corresponding to the height $h_1$ may be referred to as a fourth-first slope $i_{41}$, a region corresponding to the height $h_2$ may be referred to as a fourth-second slope $i_{42}$, a region corresponding to the height $h_3$ may be referred to as a fourth-third slope $i_{43}$, and a region corresponding to the height $h_4$ may be referred to as a fourth-fourth slope $i_{44}$.

In addition, with regard to the central area $C_0$ of the bottom surface B of the cavity, a point corresponding to the height $h_1$ may be designated by $C_1$, a point corresponding to the height $h_2$ may be designated by $C_2$, a point corresponding to the height $h_3$ may be designated by $C_0$, and a point corresponding to the height $h_4$ may be designated by $C_4$.

In FIG. 7, the reflective surfaces are equally and symmetrically formed at the third area and the fourth area of the light emitting device package.

Figure 8A:
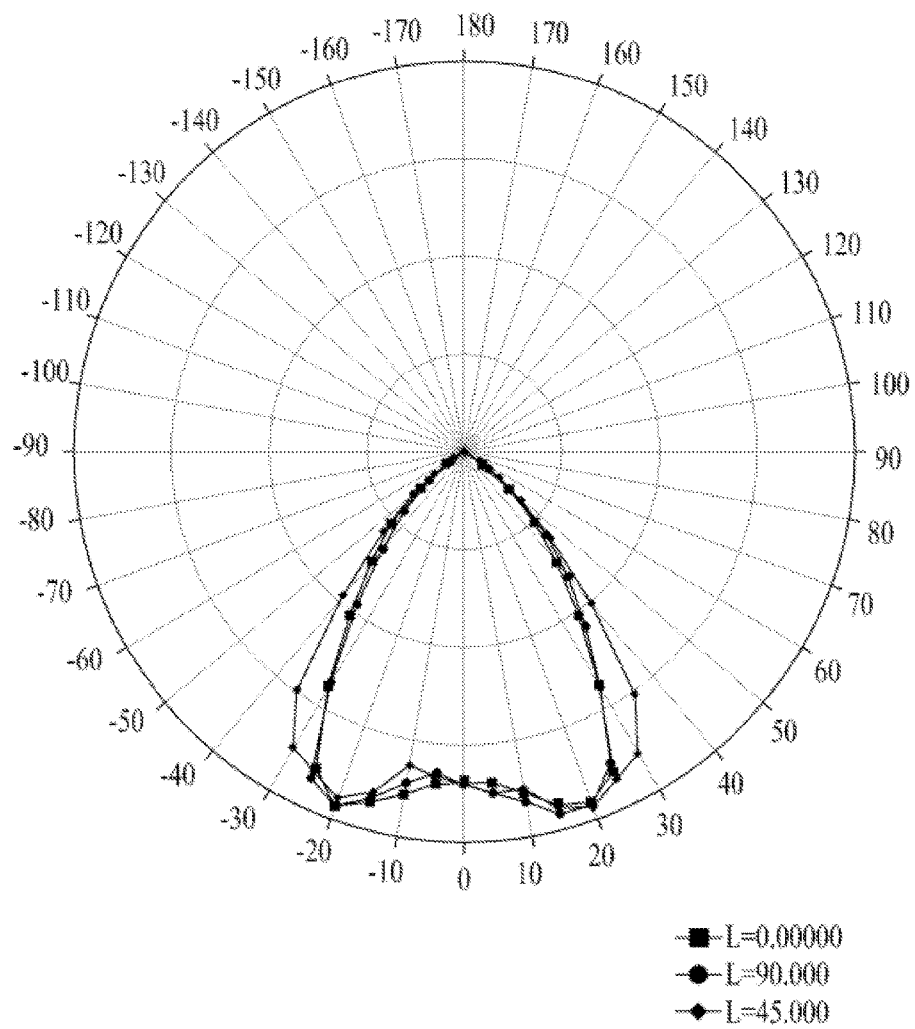
Figure 8B:
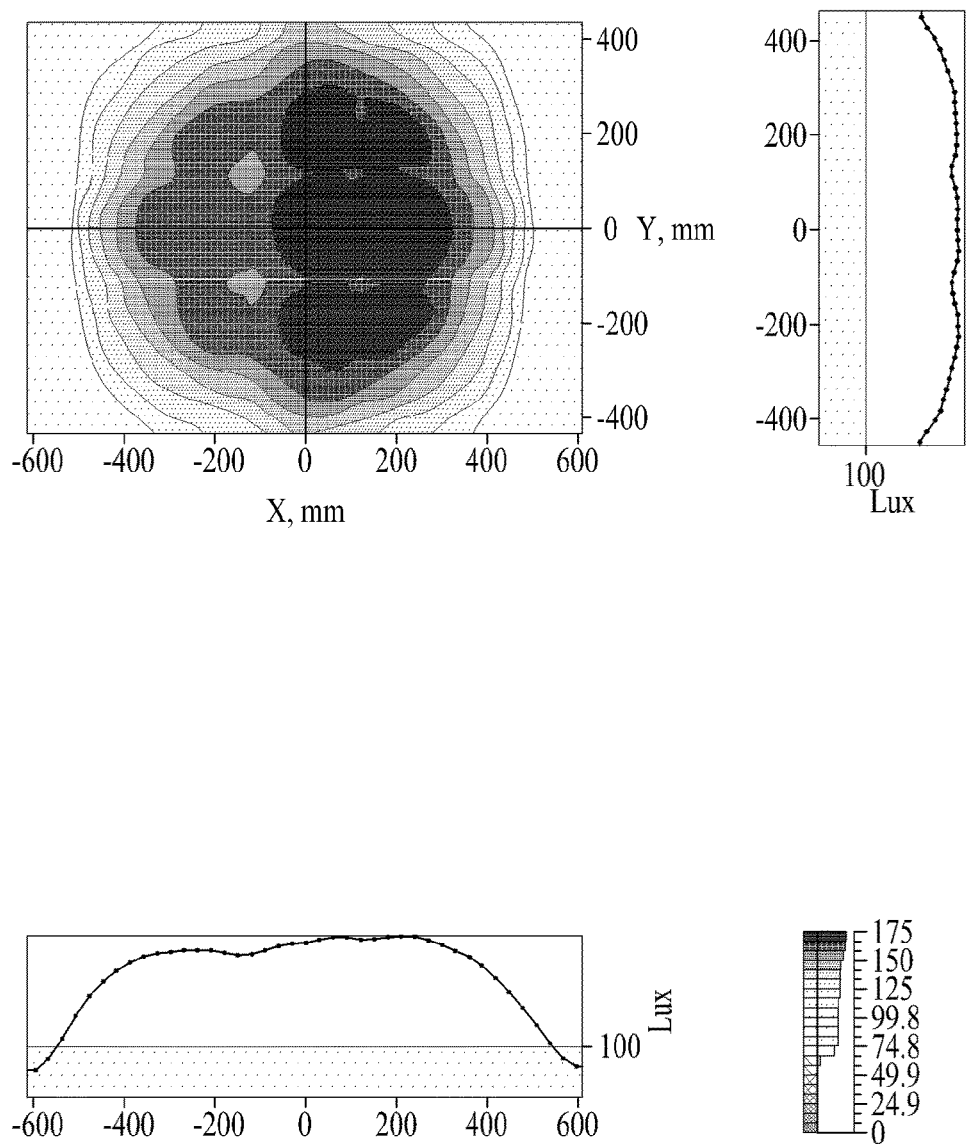

FIGS. 8A to 8C are views illustrating measured results of the flux of light emitted from the light emitting device package having the reflective surface structure according to the embodiment of Table 1.

In the graph of FIG. 8A, the -♦- line, the -●- line, and the -■- line represent the distribution of light measured in the first direction, the second direction, and the third direction between the first direction and the second direction in an area spaced apart from the opening of the light emitting device package by 1 m. As can be seen from FIGS. 8A and 8B, the flux of light substantially exhibits left-right symmetry in the central area. Referring to FIG. 8C illustrating the flux of light measured in the area spaced apart from the light emitting device package by 1 m, each of the right upper end and the left lower end has an angle of 75 degrees with respect to the light emission area of the light emitting device package.

As can be seen from FIG. 8C, Center and Area 0.3F adjacent to the Center show an even distribution of the flux of light.

Figure 9A:
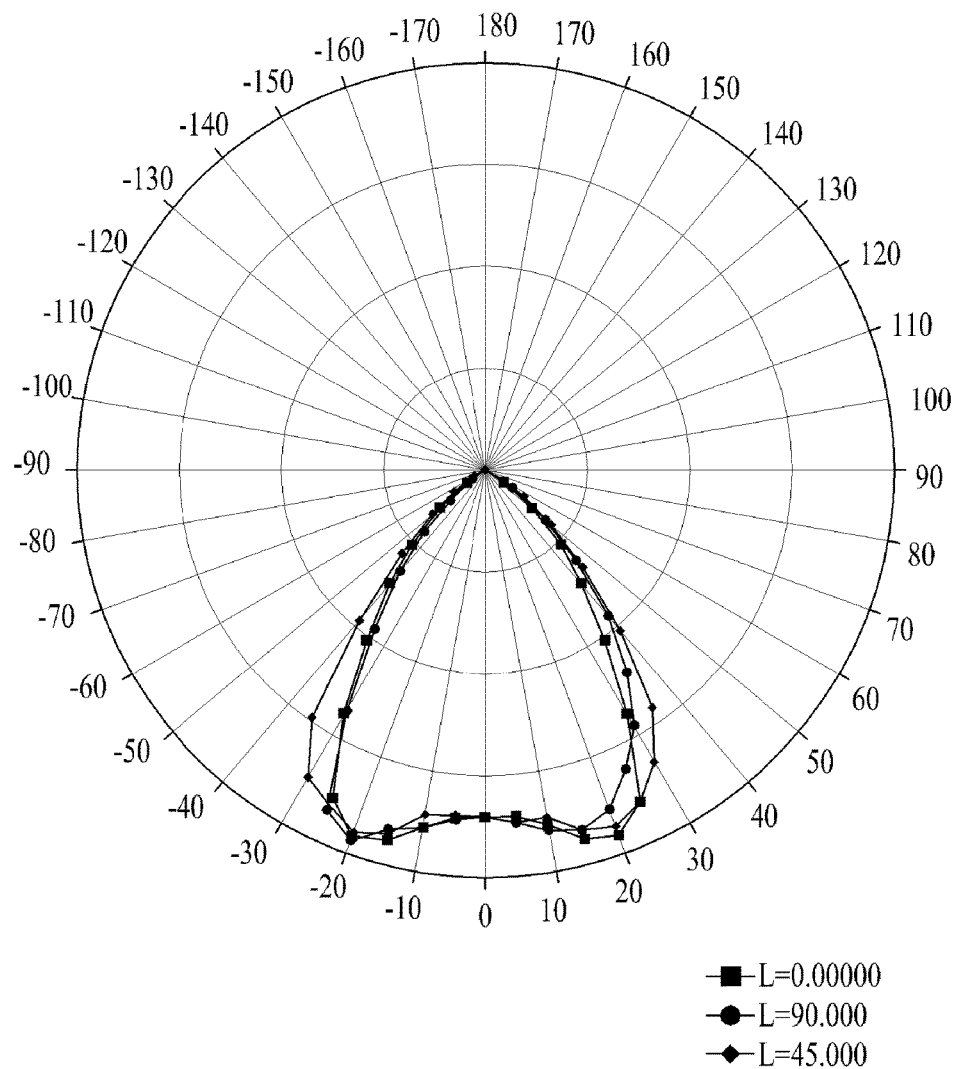
Figure 9B:
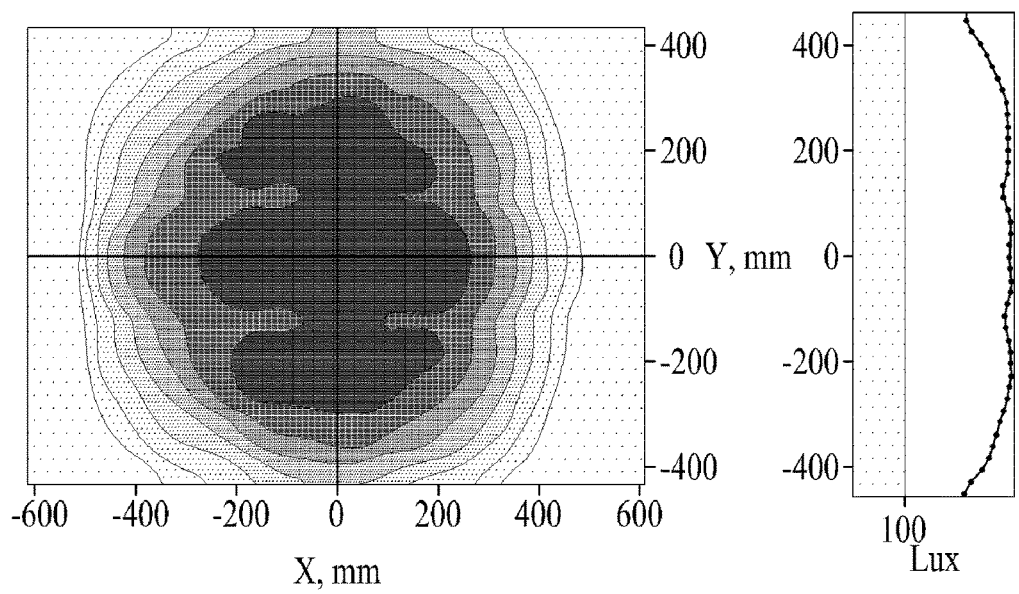
Figure 9B:
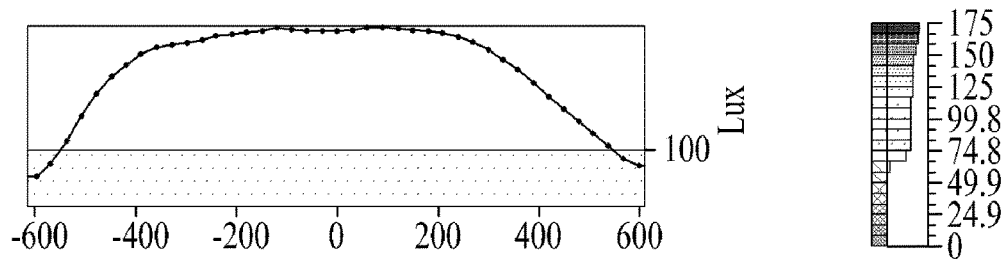
Figure 10A:
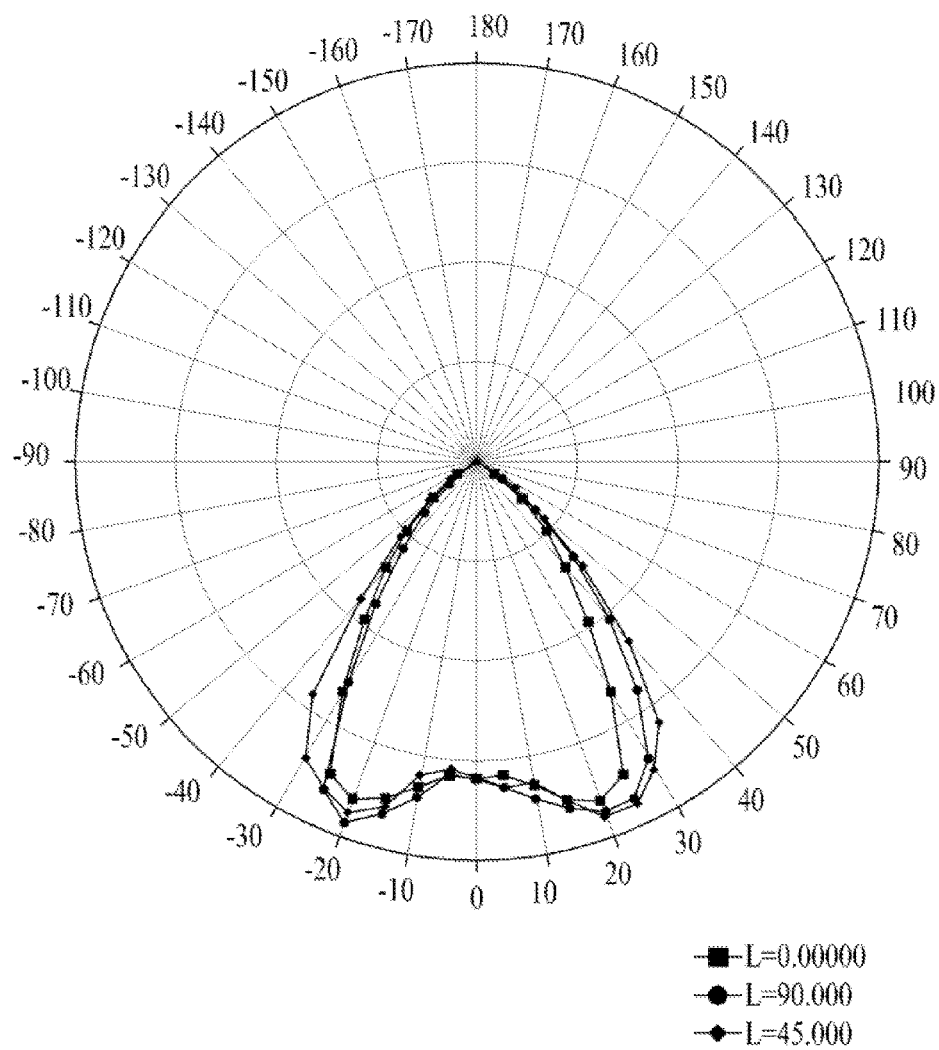
Figure 10B:
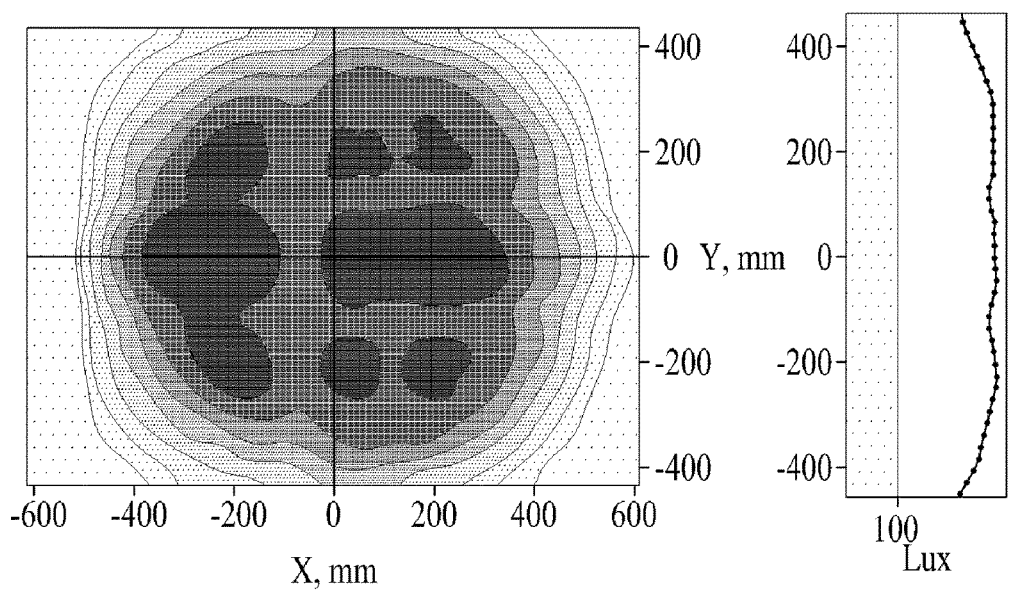
Figure 10B:
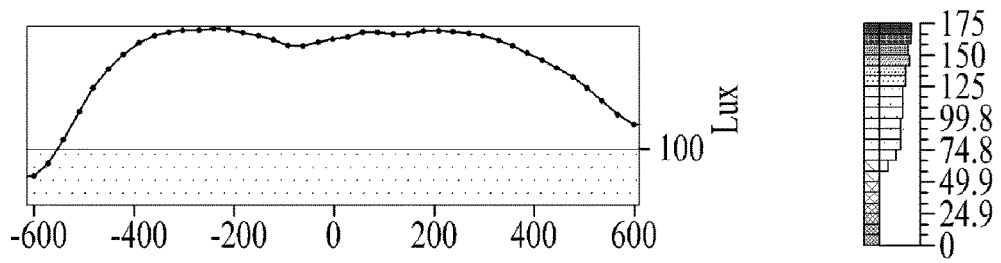

FIGS. 9A to 9C are views illustrating measured results of the flux of light emitted from the light emitting device package having the reflective surface structure according to the embodiment of Table 2, and FIGS. 10A to 10C are views illustrating measured results of the flux of light emitted from the light emitting device package having the reflective surface structure according to an embodiment of Table 3.

The fluxes of light emitted from the light emitting device packages having the reflective surface structures according to the embodiments of Table 2 and Table 3 substantially exhibit left-right and up-down symmetry.

Figure 11A:
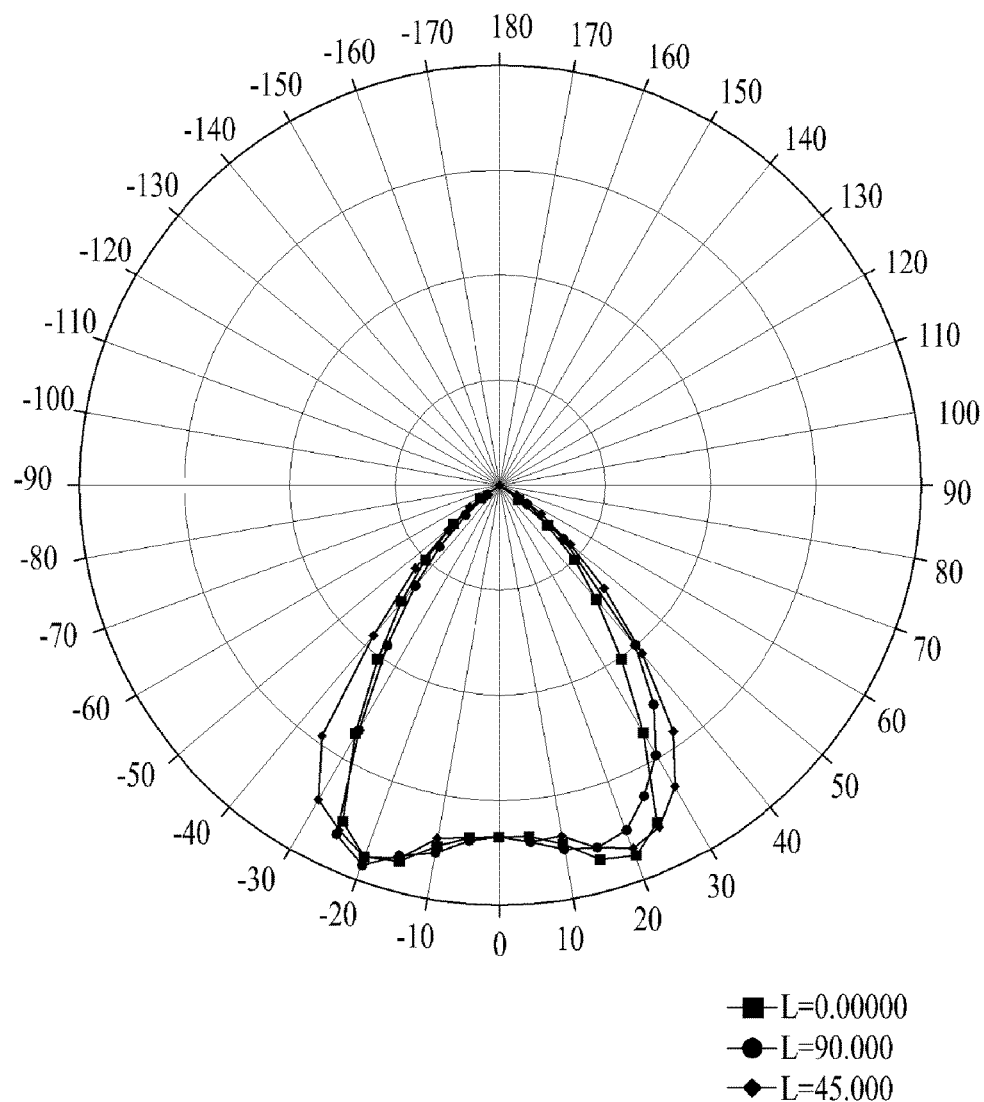
Figure 11B:
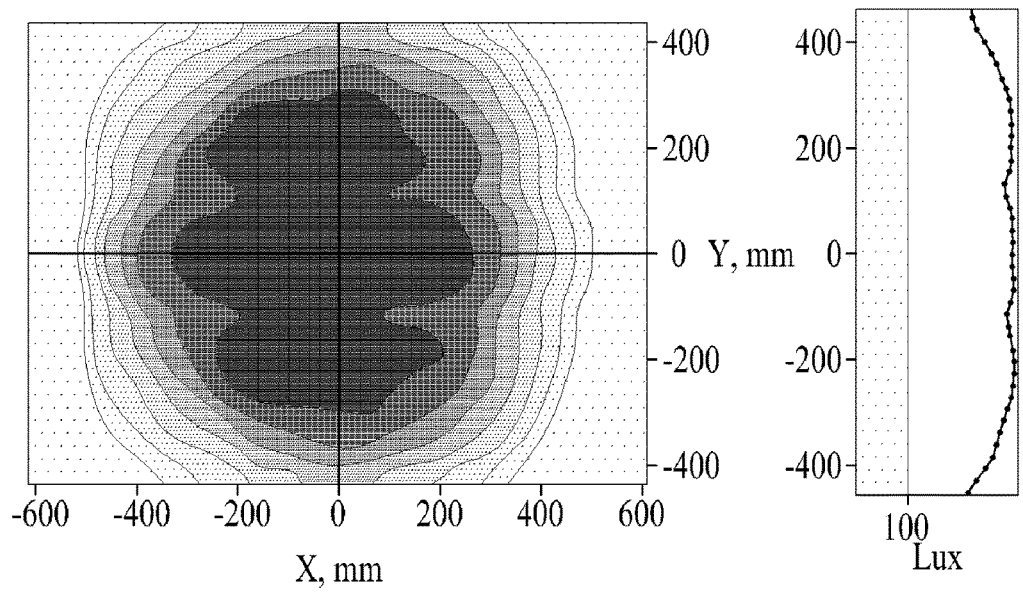
Figure 11B:
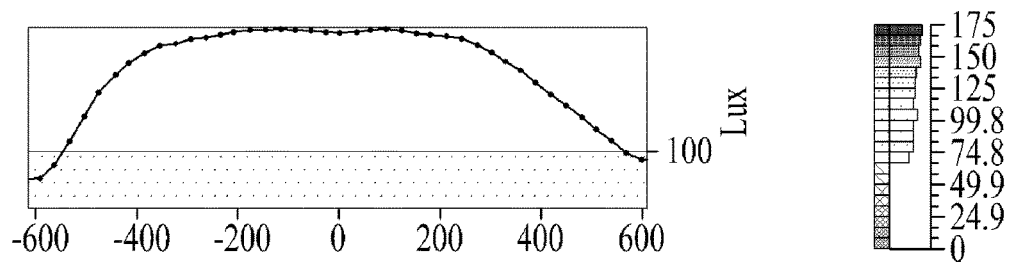

FIGS. 11A to 11C are views illustrating measured results of the flux of light emitted from a light emitting device package having a reflective surface structure according to a comparative embodiment of Table 4. In particular, as can be seen from FIG. 11C, the flux of light at Center and Area 0.3F adjacent to the Center is greater at the right side of the Center than that at the left side of the Center. That is, it can be appreciated that, due to the first electrode pad located on the right side of the light emitting device, since the flux of light increase leftward with regard to the top surface of the light emitting device and the light reflected by the reflective surface is directed in the opposite direction at the outside of the light emitting device package, the flux of light increases rightward at the outside of the light emitting device package after being reflected by the reflective surface.

It is noted that a single light emitting device or a plurality of light emitting devices may be mounted in the light emitting device package, without being limited thereto.

The light emitting device package as described above may be utilized as a light source of a lighting system. For example, the light emitting device package as described above may be used in a lighting apparatus such as a backlight unit of an image display apparatus and an illumination apparatus.

When used in the backlight unit of the image display apparatus, the light emitting device package may be used in an edge type backlight unit or a vertical type backlight unit. When used in the illumination apparatus, the light emitting device package may be used in a lamp type or bulb type light source.

As is apparent from the above description, in a light emitting device package according to the embodiments, since the flux of light emitted from a first area of the light emitting device in which a first electrode pad is located is greater than the flux of light emitted from a second area, the distance at an opening with regard to the first area may be set to be greater than the distance at the opening with regard to the second area, or the standard deviation of the tilts of four slopes constituting a reflective surface of the first area may be set to be greater than the standard deviation of the tilts of four slopes constituting a reflective surface of the second area. In this way, the flux of light emitted out of the light emitting device package may exhibit even distribution.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a first lead frame and a second lead frame on a substrate;
a light emitting device electrically connected to each of the first lead frame and the second lead frame, the light emitting device having a first electrode pad asymmetrically formed on a top surface of the light emitting device and the light emitting device with the first electrode pad is configured to output non-uniform flux of light; and
a reflective member disposed around the light emitting device to reflect light emitted from the light emitting device, the reflective member having a plurality of reflective surfaces extending upwardly from the substrate, the plurality of reflective surfaces including:
a first reflective surface closest to the first electrode pad, the first reflective surface having a plurality of sections; and
a second reflective surface opposite to the first reflective surface, the second reflective surface having a plurality of sections, each of the sections of the first reflective surface and the second reflective surface having a tilt of a slope,
wherein a standard deviation of the tilts of the slopes of the first reflective surface is greater than a standard deviation of the tilts of the slopes of the second reflective surface,
wherein the distance from a point corresponding to a central area of the light emitting device to an uppermost portion of the second reflective surface is within a range of 93.5%-98.1% of the distance from the point corresponding to the central area of the light emitting device to an uppermost portion of the first reflective surface,
wherein the first and second reflective surfaces adjust the non-uniform light output by the light emitting device with the first electrode pad for evenly distributing a flux of light output by the light emitting device package, and
wherein the first electrode pad is offset from the point corresponding to the central area of the light emitting device.

2. The package according to claim 1, wherein the reflective member is configured such that a third reflective surface having a plurality of sections and a fourth reflective surface having a plurality of sections intersect the first reflective surface and the second reflective surface, each of the sections of the third reflective surface and the fourth reflective surface having a tilt of a slope and a standard deviation of tilts of slopes of the third reflective surface is equal to a standard deviation of tilts of slopes of the fourth reflective surface.

3. The package according to claim 1, wherein the reflective member is configured such that the standard deviation of the tilts of the slopes of the first reflective surface is greater than the standard deviation of the tilts of the slopes of the second reflective surface, and equal to or less than 7 times the standard deviation of the tilts of the slopes of the second reflective surface.

4. The package according to claim 1, wherein, in a light emission area of the reflective member, a distance from a point corresponding to a central area of the light emitting device to the first reflective surface is greater than a distance from the point corresponding to the central area of the light emitting device to the second reflective surface opposite to the first reflective surface.

5. The package according to claim 1, wherein the reflective member further includes a third reflective surface and a fourth reflective surface intersecting the first reflective surface and the second reflective surface, and wherein, in a light emission area of the reflective member, a distance from a point corresponding to a central area of the light emitting device to the third reflective surface is equal to a distance from the point corresponding to the central area of the light emitting device to the fourth reflective surface.

6. The package according to claim 1, wherein, in a light emission area of the reflective member, a distance from a point corresponding to a central area of the light emitting device to the second reflective surface is smaller than a distance from the point corresponding to the central area of the light emitting device to the first reflective surface.

7. The package according to claim 1, wherein, in a light emission area of the reflective member, a distance from a point corresponding to a central area of the light emitting device to the second reflective surface is within a range from 93% to 99% of a distance from the point corresponding to the central area of the light emitting device to the first reflective surface.

8. The package according to claim 1, wherein a variation in an average tilt of the slopes constituting the first reflective surface is greater than a variation in an average tilt of the slopes constituting the second reflective surface.

9. The package according to claim 1, wherein the first electrode pad includes a pair of first electrode pads spaced apart from each other on the light emitting device.

10. The package according to claim 1, further comprising a phosphor film disposed on the light emitting device.

11. A light emitting device package comprising:
a first lead frame and a second lead frame on a substrate;
a light emitting device electrically connected to each of the first lead frame and the second lead frame, the light emitting device having a first electrode pad asymmetrically formed on a top surface of the light emitting device and the light emitting device with the first electrode pad is configured to output non-uniform flux of light; and
a reflective member disposed around the light emitting device to reflect light emitted from the light emitting device, the reflective member having a plurality of reflective surfaces extending upwardly from the substrate,
wherein, in a light emission area of the reflective member, a distance from a point corresponding to a central area of the light emitting device to a reflective surface of a first reflective surface, closest to the first electrode pad, is greater than a distance from the point corresponding to the central area of the light emitting device to a second reflective surface opposite to the first area,
wherein a third reflective surface and a fourth reflective surface intersect the first reflective surface and the second reflective surface,
wherein the third reflective surface has a plurality of sections and the fourth reflective surface has a plurality of sections, each of the sections of the third reflective surface and the fourth reflective surface having a tilt of a slope, wherein a standard deviation of the tilts of the slopes of the third reflective surface is equal to a standard deviation of the tilts of the slopes of the fourth reflective surface,
wherein the distance from a point corresponding to the central area of the light emitting device to an uppermost portion of the second reflective surface is within a range of 93.5%-98.1% of the distance from the point corresponding to the central area of the light emitting device to an uppermost portion of the first reflective surface,
wherein the first, second, third and fourth reflective surfaces adjust the non-uniform light output by the light emitting device with the first electrode pad for evenly distributing a flux of light output by the light emitting device package, and
wherein the first electrode pad is offset from the point corresponding to the central area of the light emitting device.

12. The package according to claim 11, wherein, in the light emission area of the reflective member, a distance from the point corresponding to the central area of the light emitting device to the third reflective surface is equal to a distance from the point corresponding to the central area of the light emitting device to the fourth reflective surface.

13. The package according to claim 11, wherein, in the light emission area of the reflective member, the distance from the point corresponding to the central area of the light emitting device to the second reflective surface is within a range from 93% to 99% of the distance from the point corresponding to the central area of the light emitting device to the first reflective surface.

14. The package according to claim 11, wherein the first reflective surface has a plurality of sections and the second reflective surface has a plurality of sections, each of the sections of the first reflective surface and the second reflective surface having a tilt of a slope, and
wherein the reflective member is configured such that a standard deviation of the tilts of the slopes of the first reflective surface is greater than a standard deviation of the tilts of the slopes of the second reflective surface.

15. The package according to claim 11, wherein the first reflective surface has a plurality of sections and the second reflective surface has a plurality of sections, each of the sections of the first reflective surface and the second reflective surface having a tilt of a slope, and
wherein the reflective member is configured such that a standard deviation of the tilts of the slopes of the first reflective surface is greater than a standard deviation of the tilts of the slopes constituting the second reflective surface, and equal to or less than 7 times the standard deviation of the tilts of the slopes of the second reflective surface.

16. The package according to claim 11, wherein the first reflective surface has a plurality of sections and the second reflective surface has a plurality of sections, each of the sections of the first reflective surface and the second reflective surface having a tilt of a slope, and
wherein a variation in an average tilt of the slopes of the first reflective surface is greater than a variation in an average tilt of the slopes of the second reflective surface.

17. The package according to claim 11, wherein the first electrode pad includes a pair of first electrode pads spaced apart from each other on the light emitting device.

18. The package according to claim 11, further comprising a phosphor film disposed on the light emitting device.

19. A light emitting device package comprising:

a first lead frame and a second lead frame on a substrate;

a light emitting device electrically connected to each of the first lead frame and the second lead frame, the light emitting device having a first electrode pad asymmetrically formed on a top surface thereof and the light emitting device with the first electrode pad is configured to output non-uniform flux of light; and a reflective member disposed around the light emitting device to reflect light emitted from the light emitting device, the reflective member having a plurality of reflective surfaces extending upwardly from the substrate, wherein a first reflective surface closest to the first electrode pad has a different curvature than a second reflective surface opposite the first reflective surface, wherein the distance from a point corresponding to a central area of the light emitting device to an uppermost portion of the second reflective surface is within a range of 93.5%-98.1% of the distance from the point corresponding to the central area of the light emitting device to an uppermost portion of the first reflective surface, wherein the first and second reflective surfaces adjust the non-uniform light output by the light emitting device with the first electrode pad for evenly distributing a flux of light Output by the light emitting device package, and wherein the first electrode pad is offset from the point corresponding to the central area of the light emitting device.

* * * * *